US010128151B2

(12) United States Patent
Kamineni et al.

(10) Patent No.: US 10,128,151 B2
(45) Date of Patent: Nov. 13, 2018

(54) DEVICES AND METHODS OF COBALT FILL METALLIZATION (71) Applicant: GLOBALFOUNDRIES Inc., Grand Cayman (KY)

(72) Inventors: Vimal Kamineni, Mechanicville, NY (US); James Kelly, Schenectady, NY (US); Praneet Adusumilli, Albany, NY (US); Oscar Van Der Straten, Guilderland Center, NY (US); Balasubramanian Pranatharthiharan, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/381,826

(22) Filed: Dec. 16, 2016

(65) Prior Publication Data

US 2018/0174965 A1    Jun. 21, 2018

(51) Int. Cl.
*H01L 21/76* (2006.01)
*H01L 21/768* (2006.01)
*H01L 23/532* (2006.01)

(52) U.S. Cl.
CPC .. *H01L 21/76883* (2013.01); *H01L 21/76882* (2013.01); *H01L 23/53209* (2013.01)

(58) Field of Classification Search
CPC ..... H01L 23/53; H01L 23/532; H01L 23/532; H01L 23/53209; H01L 23/5324; H01L 23/53247; H01L 23/5326; H01L 23/53261; H01L 23/53266; H01L 21/76; H01L 21/768; H01L 21/7688; H01L 21/76882; H01L 21/76883

USPC .................................................. 257/771, 751
See application file for complete search history.

(56) References Cited

U.S. PATENT DOCUMENTS 6,224,737 B1    5/2001  Tsai et al.
6,399,479 B1    6/2002  Chen et al.
9,362,377 B1    6/2016  Kim et al.
9,514,983 B2 *  12/2016 Jezewski .............. H01L 23/485
(Continued)

FOREIGN PATENT DOCUMENTS

TW        201533845        9/2015
WO     2013/148490 A1     3/2013

*Primary Examiner* — Monica D Harrison
(74) *Attorney, Agent, or Firm* — Heslin Rothenberg Farley & Mesiti P.C.; Nathan B. Davis (57) ABSTRACT Devices and methods of fabricating integrated circuit devices via cobalt fill metallization are provided. A method includes, for instance, providing an intermediate semiconductor device having at least one trench, forming at least one layer of semiconductor material on the device, depositing a first cobalt (Co) layer on the second layer, and performing an anneal reflow process on the device. Also provided are intermediate semiconductor devices. An intermediate semiconductor device includes, for instance, at least one trench formed within the device, the trench having a bottom portion and sidewalls, at least one layer of semiconductor material disposed on the device, a first cobalt (Co) layer disposed on the at least one layer of semiconductor material, wherein the at least one layer of semiconductor material includes at least a first semiconductor material and a second semiconductor material.

17 Claims, 7 Drawing Sheets (56) References Cited

U.S. PATENT DOCUMENTS

2014/0008812 A1 1/2014 Emesh
2017/0170062 A1* 6/2017 Murray ............ H01L 21/76879

* cited by examiner

DEVICES AND METHODS OF COBALT FILL METALLIZATION

FIELD OF THE DISCLOSURE

The present disclosure relates to semiconductor devices and methods of fabricating semiconductor devices, and more particularly, to devices and methods of cobalt fill metallization.

BACKGROUND OF THE DISCLOSURE

Multiple middle-of-line (MOL) levels have been designed at the 7NM node to provide wiring flexibility for system on chips (SOC) applications. Contact levels, such as TS, CA/CB and MO levels, make up the MOL contact levels that need to be metallized.

As interconnect contact dimensions shrink, other gap fill materials are being considered as replacements for tungsten (W) based contacts. Titanium (Ti) based liners are necessary to form source/drain silicide contact at TS level and act for gettering oxygen at the CA/CB/MO levels. A thin atomic layer deposition (ALD) titanium nitride (TiN) barrier is also required to improve adhesion of alternative gap fill materials. However, RF physical vapor deposition (PVD) Ti liner deposition causes overhang at the top of the trench feature, often referred to as bread loafing, leading to a re-entrant profile, which is challenging for gap fill and leads to voids being formed during metal fill processes.

SUMMARY OF THE DISCLOSURE

The shortcomings of the prior art are overcome and additional advantage are provided through the provisions of devices and methods of fill metallization using cobalt reflow process. In one embodiment of the disclosure, a method includes, for instance, providing an intermediate semiconductor device having at least one trench, forming at least one layer of semiconductor material on the device, depositing a first cobalt (Co) layer on the forming at least one layer of semiconductor material, and performing an anneal reflow process on the device.

In another embodiment, an intermediate semiconductor device is provided which includes, for instance, at least one trench formed within the device, the trench having a bottom surface and sidewalls, at least one layer of semiconductor material disposed on the device, and a first cobalt (Co) layer disposed on the at least one layer of semiconductor material, wherein the at least one layer of semiconductor material includes at least a first semiconductor material and a second semiconductor material.

Additional features and advantages are realized through the principles of the present disclosure. Other embodiments of the disclosure are described in detail herein and are considered to be part of the claimed disclosure.

BRIEF DESCRIPTION OF THE DRAWINGS

One or more embodiments of the present disclosure are particularly pointed out and distinctly claimed as examples in the claims at the conclusion of the specification. The foregoing and other objects, features, and advantages of the disclosure are apparent from the following detailed description taken in conjunction with the accompanying drawings in which:

DETAILED DESCRIPTION

The present disclosure and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the disclosure in detail. It should be understood, however, that the detailed description and the specific examples, while indicating embodiments of the disclosure, are given by way of illustration only, and are not by way of limitation. Various substitutions, modifications, additions and/or arrangements within the spirit and/or scope of the underlying concepts will be apparent to those skilled in the art from this disclosure. Note that these figures are not drawn to scale in order to facilitate understanding of the disclosure, and that the same reference numerals used throughout different figures designate the same or similar elements.

Generally stated, disclosed herein are certain integrated circuits, which provide advantages over the above noted, existing semiconductor devices and fabrication processes. Advantageously, the integrated circuit device fabrication processes disclosed herein provide for semiconductor devices having substantially void-free gap fill in re-entrant interconnect contact features.

FIGS. 1-11 depict, by way of example, embodiments of a portion of a semiconductor device formation process and a portion of an intermediate semiconductor structure, in accordance with one or more embodiments of the present disclosure.

Figure 1:
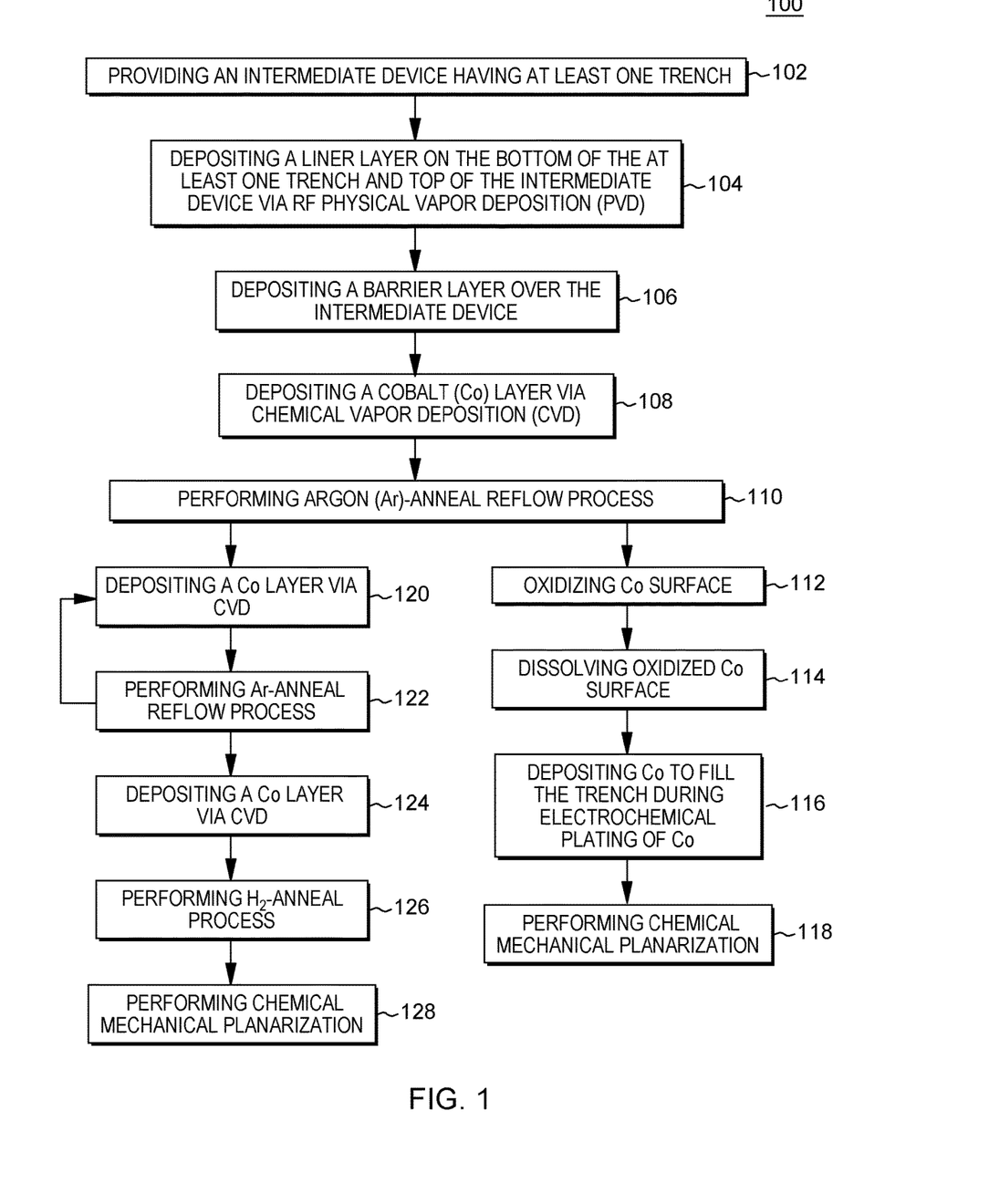
FIG. 1 is a flow chart of methods of forming an intermediate semiconductor structure according to an embodiment of the present disclosure.

With reference to FIG. 1, in one embodiment, a method 100 of forming an integrated circuit device is disclosed. The method 100 includes, for instance, at 102 providing an intermediate device having at least one trench, at 104 depositing a liner layer on the bottom of the at least one trench and top of the intermediate device via RF physical vapor deposition (PVD), at 106 depositing a barrier layer over the intermediate device, at 108 depositing a cobalt (Co) layer via chemical vapor deposition (CVD), at 110 performing argon (Ar)-anneal reflow process, at 112 oxidizing the Co surface, at 114 dissolving the oxidized Co surface, at 116 depositing Co to fill the trench during the electrochemical plating of Co, and at 118 performing chemical mechanical planarization on the device.

With reference still to FIG. 1, in another embodiment, the method 100 includes for instance, at 102 providing an intermediate device having at least one trench, at 104 depositing a liner layer on the bottom of the at least one trench and top of the intermediate device via RF physical vapor deposition (PVD), at 106 depositing a barrier layer over the intermediate device, at 108 depositing a cobalt (Co) layer via chemical vapor deposition (CVD), at 110 performing argon (Ar)-anneal reflow process, at 120 depositing a cobalt (Co) layer via chemical vapor deposition (CVD), at 122 performing argon (Ar)-anneal reflow process, at 124 depositing another Co layer via CVD, at 126 performing an Hz-anneal process, and at 128 performing chemical mechanical planarization on the device.

In another embodiment, the method 100 includes for instance, at 102 providing an intermediate device having at least one trench, at 104 depositing a liner layer on the bottom of the at least one trench and top of the intermediate device via RF physical vapor deposition (PVD), at 106 depositing a barrier layer over the intermediate device, at 108 depositing a cobalt (Co) layer via chemical vapor deposition (CVD), at 110 performing argon (Ar)-anneal reflow process, at 120 depositing a cobalt (Co) layer via chemical vapor deposition (CVD), at 122 performing argon (Ar)-anneal reflow process, then additional cycles of steps at 120 depositing a Co layer via CVD and at 122 performing Ar-anneal reflow process, where one cycle includes at 120 depositing a Co layer via CVD and at 122 performing Ar-anneal reflow process. Then at 124 depositing another Co layer via CVD, at 126 performing an Hz-anneal process, and at 128 performing chemical mechanical planarization on the device.

For example, the method 100 may include 1 additional cycle, and in such embodiment, the method 100 may include at 102 providing an intermediate device having at least one trench, at 104 depositing a liner layer on the bottom of the at least one trench and top of the intermediate device via RF physical vapor deposition (PVD), at 106 depositing a barrier layer over the intermediate device, at 108 depositing a cobalt (Co) layer via chemical vapor deposition (CVD), at 110 performing argon (Ar)-anneal reflow process, at 120 depositing a cobalt (Co) layer via chemical vapor deposition (CVD), at 122 performing argon (Ar)-anneal reflow process, then at 120 depositing a Co layer via CVD, at 122 performing Ar-anneal reflow process, at 124 depositing another Co layer via CVD, at 126 performing an Hz-anneal process, and at 128 performing chemical mechanical planarization on the device. Method 100 include two, three, four or more additional cycles of step(s) at 120 and at 122. For each reflow cycle described above, the Co layer thickness can include between 2 nm and 20 nm, and the temperature range for each cycle may include 300° C. to 500° C.

FIGS. 2-9 depict, by way of example only, one detailed embodiment of a portion of a semiconductor device formation process and a portion of an intermediate semiconductor structure, according to one or more embodiments of the present disclosure.

Figure 2:
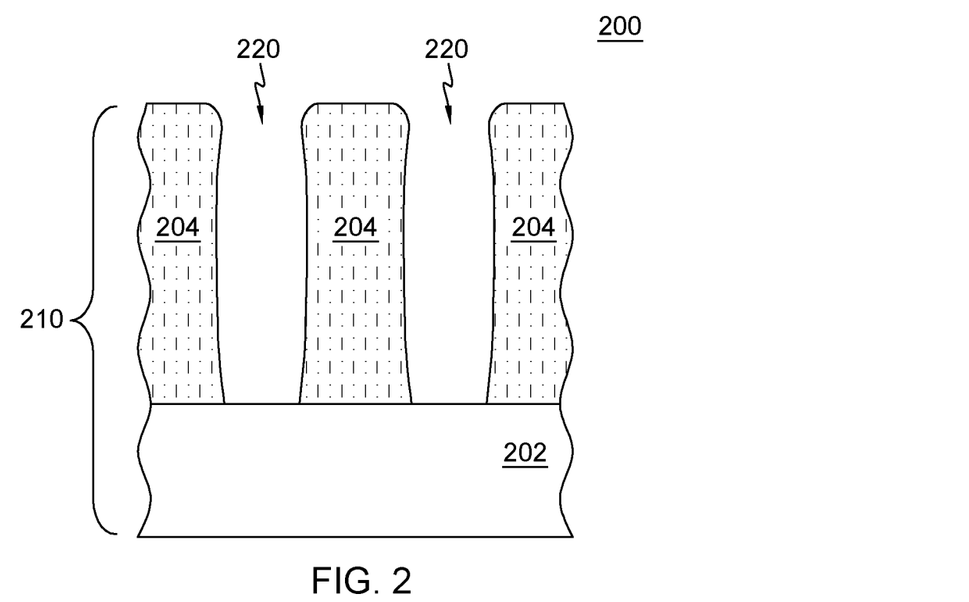
FIG. 2 depicts a cross-sectional elevation view of one embodiment of an intermediate semiconductor structure according to an embodiment of the present disclosure.

FIG. 2 depicts a portion of an intermediate semiconductor device generally denoted 200, depicted at an intermediate semiconductor fabrication stage. The device 200 may have been processed through initial device processing steps in accordance with the design of the device 200 being fabricated. For example, the device 200 may include, for instance, a substrate 210 and at least one trench 220 formed within device 200. Substrate 210 may include one or more layers of any suitable material, for instance, silicon, dielectric material, and/or combination thereof. For example, as shown in FIG. 2, device 200 may include an inter-level dielectric (ILD) layer 204 wherein at least one trench 220 may be formed, and another bottom layer 202 having, for example, silicon or a dielectric material.

Figure 3A:
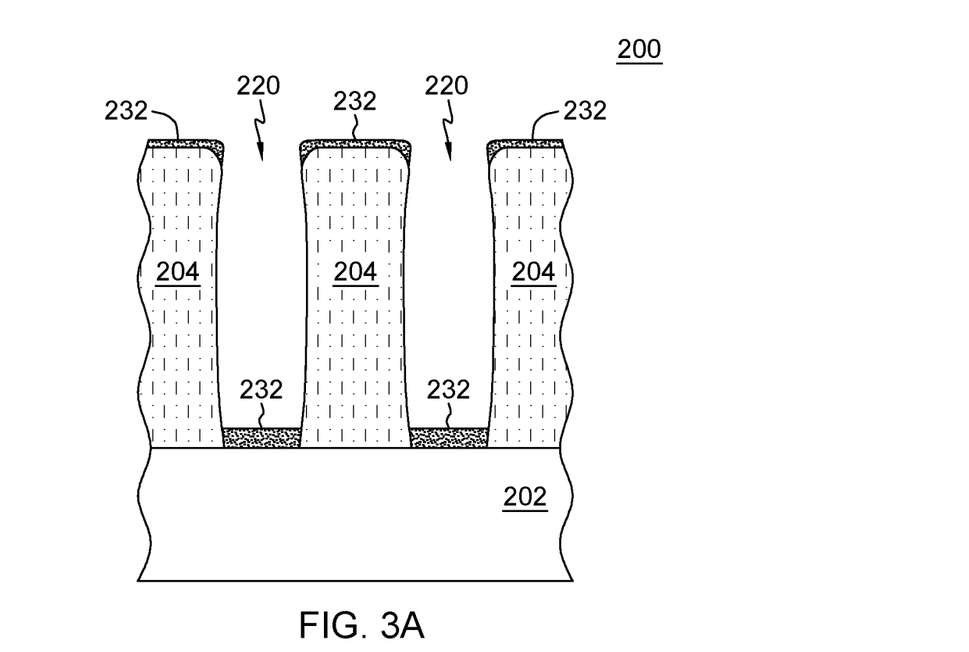
FIG. 3A depicts the structure of FIG. 2 after depositing a layer of first semiconductor material.
Figure 3B:
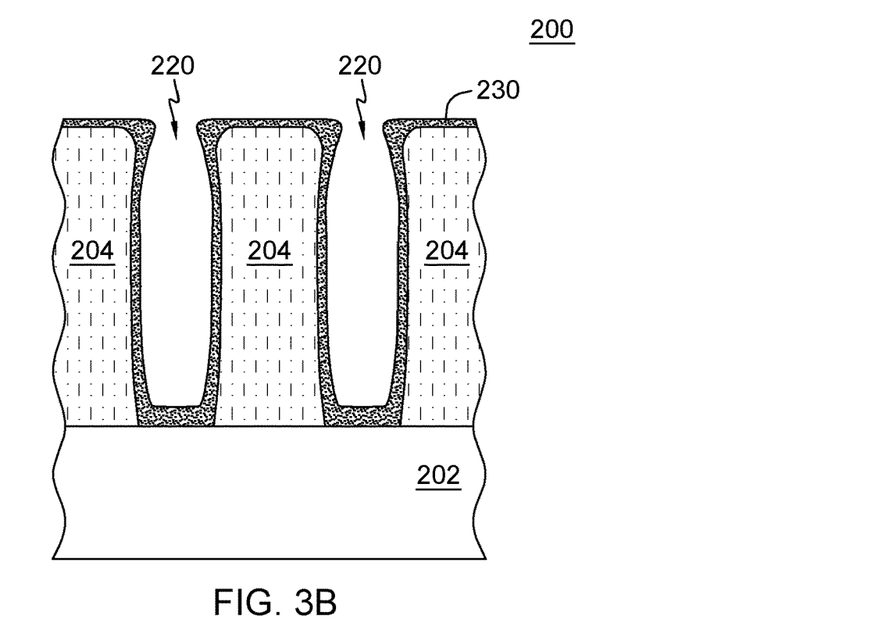
FIG. 3B depicts the structure of FIG. 3A after depositing a layer of second semiconductor material.

With reference to FIGS. 3A and 3B, a layer of semiconductor material 230 may be formed on device 200 via, for example, deposition. For instance, layer 230 may be a conformal layer disposed on device 200 and on the surface of one or more trenches 220. Layer 230 may be deposited in one or more deposition processes and any suitable material may be deposited, such as, titanium (Ti), titanium nitride (TiN), nickel (Ni), nickel platinum (NiPt), cobalt (Co), tungsten carbide (WC), tungsten nitride (WN), tantalum nitride (TaN), ruthenium (Ru) or combination thereof. For instance, as shown in FIG. 3A, layer 230 may be formed by depositing a layer of first semiconductor material 232 may be deposited to form, for example, a liner layer. First semiconductor material layer 232 may be formed on the upper surface of device 200 and bottom surface of one or more trenches 220, with no or minimal first semiconductor material disposed on sidewalls of trenches 220. First semiconductor material layer 232, i.e. the liner layer, may be formed by depositing, for example, Ti, Ni, NiPt, and/or Co, via RFPVD, for instance. A layer of second semiconductor material (not shown) may be deposited to form, for example, a barrier layer or an adhesion layer. The layer of second semiconductor material, i.e. barrier layer or adhesion layer, may be formed on first semiconductor material layer 232 and over device 200 by depositing, for example, TiN, WC, WN, TaN, and/or Ru via atomic layer deposition (ALD), for instance.

As shown in FIG. 3B, the first semiconductor material layer and the second layer of semiconductor material together may form semiconductor material layer 230, which may be referred to as a liner/barrier layer, on device 200.

The second semiconductor material layer, i.e. the barrier layer or adhesion layer, may be a thin layer and may be a conformal layer. Any suitable deposition methods may be used to deposit the first layer or second layer, for example, metal organic chemical vapor deposition (MOCVD) or chemical vapor deposition (CVD). One skilled in the art would be familiar with the processes and materials for depositing the first semiconductor material layer and second semiconductor material layer to form, for example, a liner/barrier layer, such as a Ti/TiN layer, over an intermediate semiconductor device.

Figure 4:
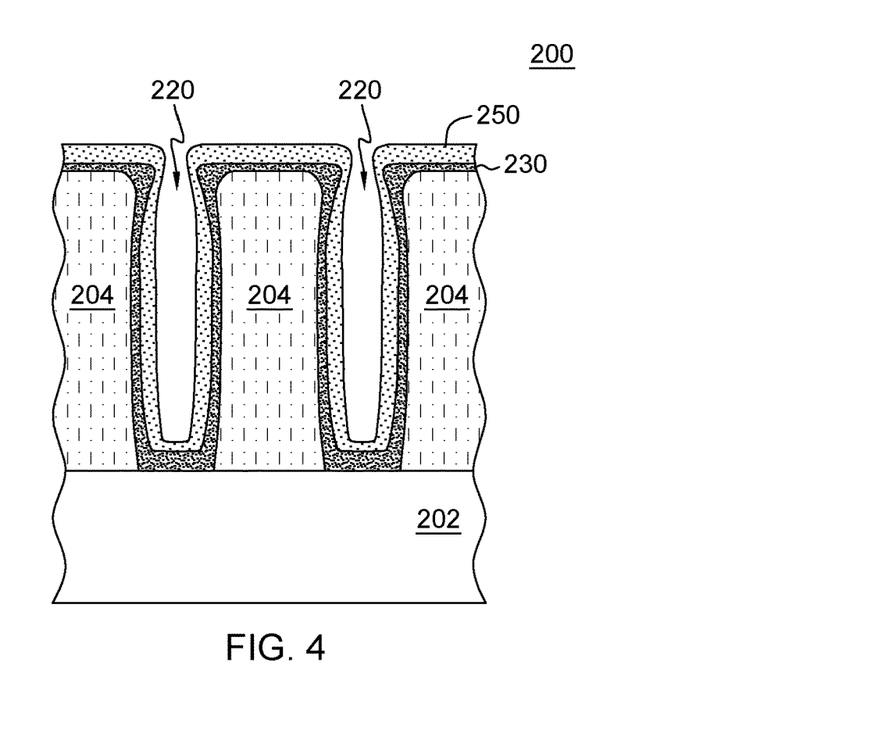
FIG. 4 depicts the structure of FIG. 3B after depositing a first cobalt layer.

As depicted in FIG. 4, cobalt (Co) may be deposited over device 200 to form a first Co layer 250 on liner/barrier layer 230 disposed on device 200, including within trenches 220. First Co layer 250 may be deposited via any suitable deposition process, for example, CVD, and may form a thin, conformal layer on device 200. First Co layer 250 may also be a continuous layer.

Figure 5:
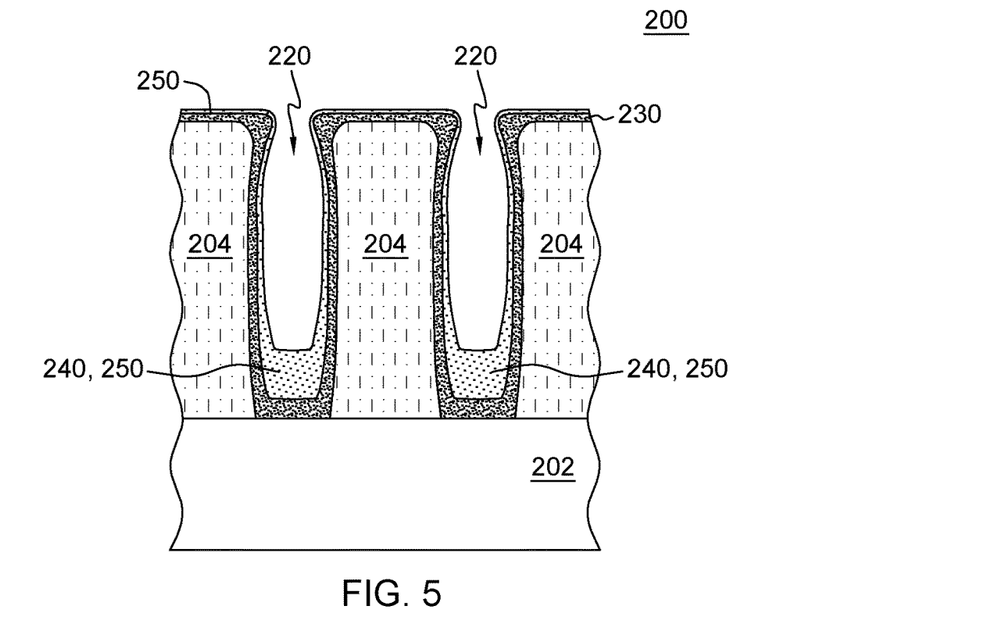
FIG. 5 depicts the structure of FIG. 4 after performing an argon anneal reflow process.

With reference to FIG. 5, an anneal reflow process may be performed on device 200, for example, an argon (Ar)-anneal reflow process. As will be appreciated, the Ar-anneal reflow process is subtle, i.e. selectively moves the cobalt, such that first Co layer 250 may reflow to the bottom portion of one or more trenches 220 via for example, capillary action. As will also be appreciated, the Ar-anneal reflow process allows for a controlled movement of Co and reduces the thickness of first Co layer 250 on sidewalls of trenches 220, particularly the upper sidewall portions, to minimize the re-entrant profile of one or more trenches 220. Other gases that allow for selective movement of Co and/or uniform movement of Co may be used, for instance, inert gases such as, $N_2$ and He. Ambient gases present during the anneal reflow process may remove impurities from the deposited Co layer, which may promote pure Co grain growth.

Figure 6:
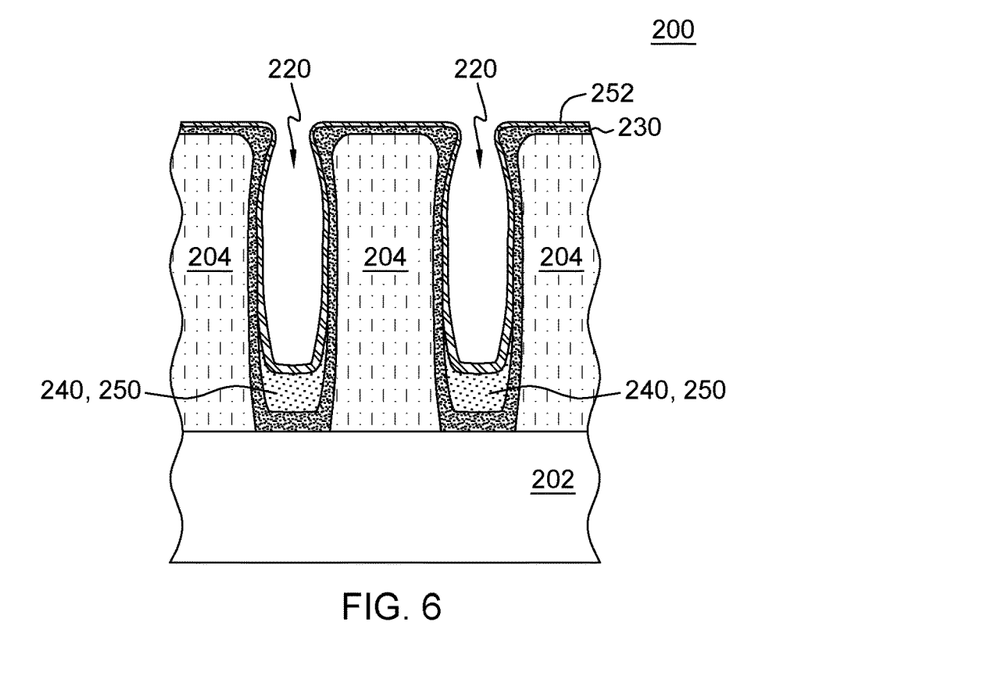
FIG. 6 depicts the structure of FIG. 5 after oxidation of at least a portion of the first cobalt layer.

As depicted in FIG. 6, a portion of first Co layer 250 may be oxidized. Oxidation of a portion of first Co layer 250 may be achieved by, for instance, performing an $O_2$ plasma treatment to device 200, or otherwise exposing device 200 to air. The portion of first Co layer 250 that has been oxidized, i.e. oxidized Co layer 252, may be disposed on the surface of first Co layer 250 where $O_2$ plasma treatment was performed and/or Co was exposed to air.

Figure 7:
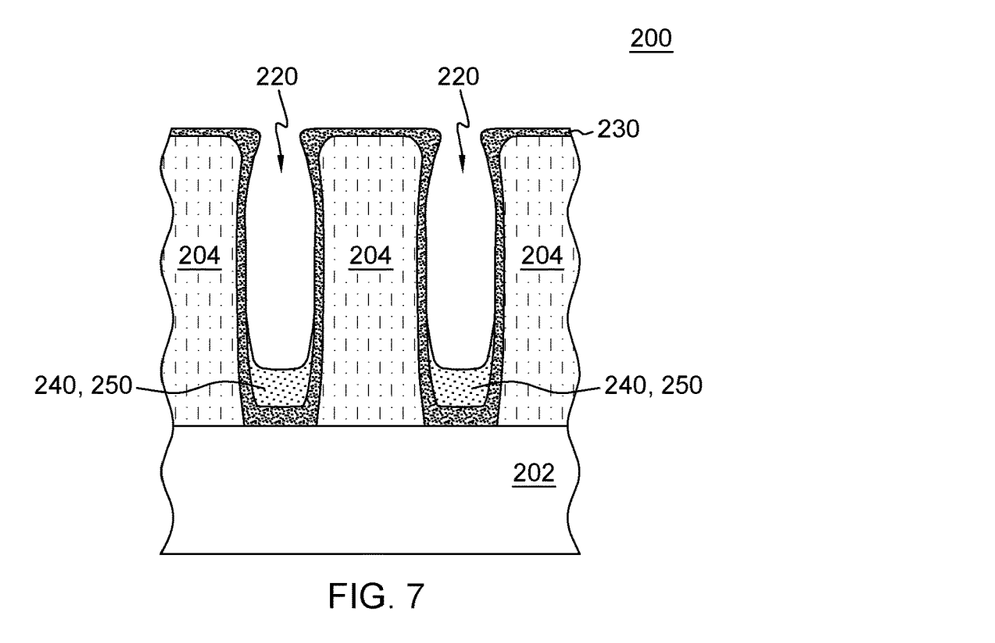
FIG. 7 depicts the structure of FIG. 6 after removing the oxidized cobalt.

As depicted in FIG. 7, oxidized Co layer 252 may be removed from device 200, such that first Co layer 250 remains on the bottom portion of trenches 220 with little to no first Co layer 250 on the sidewalls of trenches 220. Oxidized Co 252 may be removed via, for instance, an electrochemical bath, dry etching, wet etching or combination thereof. Oxidized Co 252 may be removed, for example, in an acidic bath during the electrochemical deposition of Co. Additives may be added to the bath that may deter growth of Co on the sidewalls of the trenches and/or promote growth on the bottom portion of the trenches.

Figure 8:
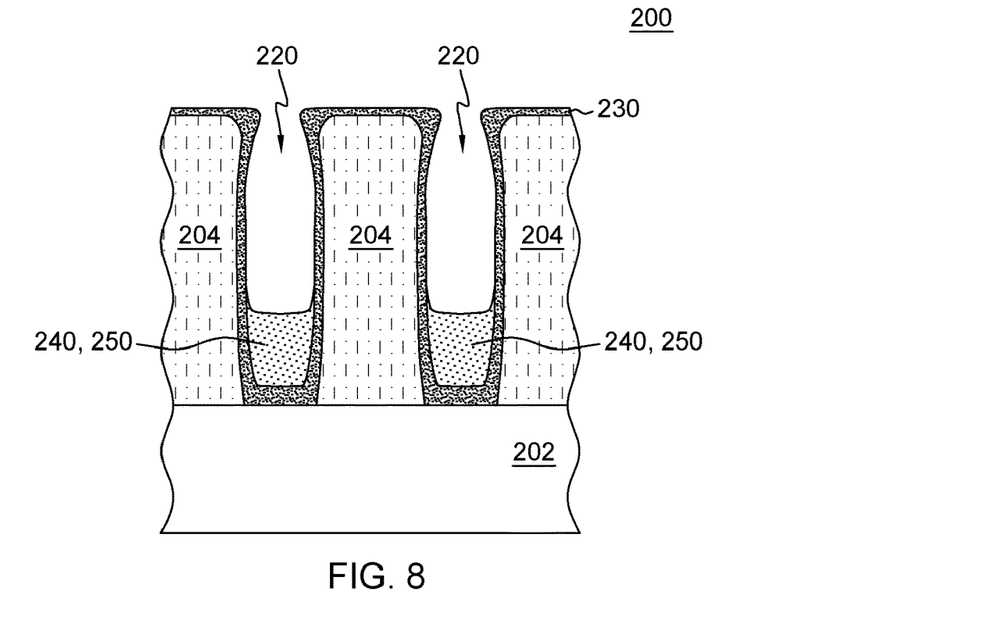
FIG. 8 depicts the structure of FIG. 7 during a bottom-up fill process.

With reference to FIG. 8, Co may be deposited in one or more trenches 220 via, for instance, a bottom-up fill. A "bottom-up" process or "bottom up" fill is used herein to describe the deposition or the formation of Co on the bottom of an opening, a via, a trench, or an aperture within a substrate and the continued process of depositing or forming Co from the bottom of the trench up to the top of the opening. A bottom-up fill forms no material or substantially no material on the sidewalls of the trench prior to the Co reaching that point in the trench. As a result, there is no competitive sidewall or top-down growth of Co in the trench, leading to a substantially or completely void free fill of the trench with Co.

Figure 9:
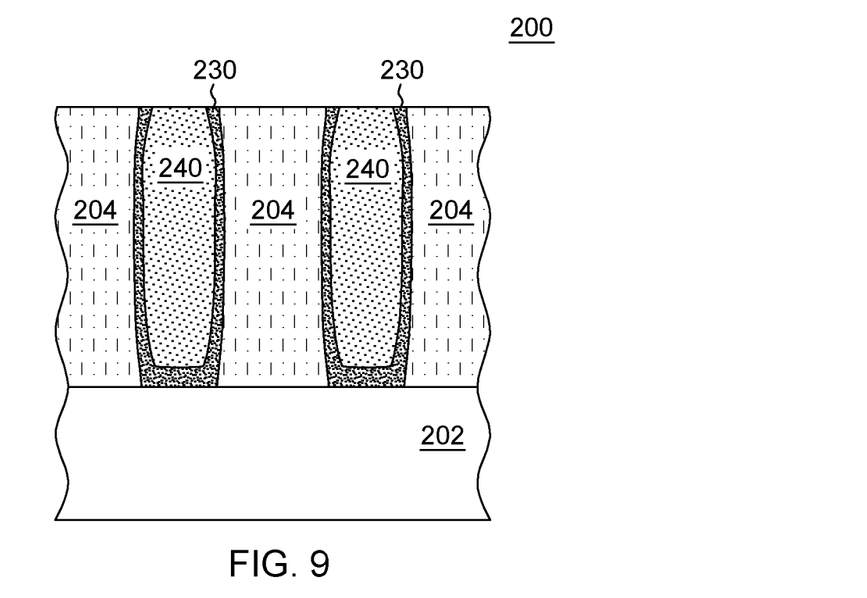
FIG. 9 depicts the structure of FIG. 8 after filling the trench with cobalt and planarization.

As depicted in FIG. 9, after the bottom-up fill of Co in trenches 220, device 200 may be planarized using any suitable method, for example, via chemical mechanical planarization (CMP).

Figure 10:
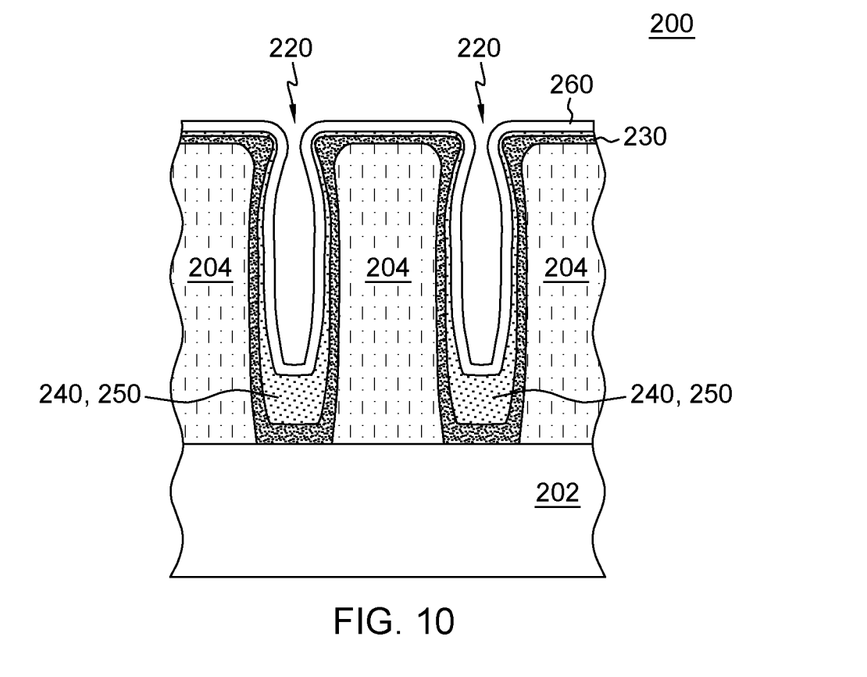
FIG. 10 depicts a cross-sectional elevation view of an intermediate semiconductor structure after depositing a cobalt layer according to an embodiment of the present disclosure.
Figure 11:
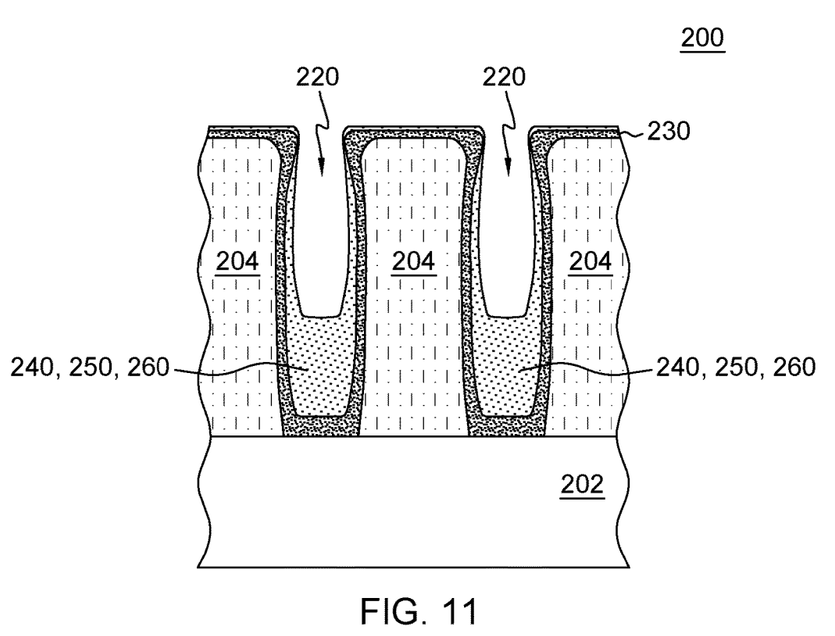
FIG. 11 depicts the structure of FIG. 10 after an argon anneal reflow process.

In another embodiment, as depicted in FIGS. 10-11, a method of the present disclosure may include one or more additional cycles of depositing Co and performing anneal reflow process, after depositing first Co layer 250 and performing an anneal reflow process. In such embodiment, after an anneal reflow process, such as an Ar-anneal reflow process, has been performed on device 200 (FIG. 5) described above, a second Co layer 260 may be deposited on device 200, as shown in FIG. 10. Similar to the deposition process of first Co layer 250 (FIG. 4), second Co layer 260 may be deposited via any suitable deposition process, for example, CVD, and may form a thin, conformal layer on Co 240 and/or first Co layer 250 (FIG. 10). Second Co layer 260 may also be continuous. A second anneal reflow process may be performed on device 200, for example, an argon-anneal reflow process, described above. In some embodiments (not shown), multiple cycles of depositing Co and performing anneal reflow processes may be performed, where each cycle includes a step of depositing Co to form a Co layer followed by performing an anneal reflow process. For instance, after the second anneal reflow process, a third Co layer may be deposited on the Co and/or the second Co layer, and a third anneal reflow process may be performed on the device, for example, an argon-anneal reflow. In other embodiments, a fourth Co layer may be deposited and a fourth anneal reflow process may be performed, and so forth. As will be appreciated, when Ar is used, the anneal reflow process may be subtle, i.e. selectively moves the cobalt, such that second Co layer 260 may reflow to the bottom portion of trenches 220 (FIG. 11) via for example, capillary action. As will also be appreciated, the Ar-anneal reflow process allows for a controlled movement of Co and reduces the thickness of second Co layer 260 on sidewalls of the trenches, particularly the upper sidewall portions, to minimize the re-entrant profile of trenches 220. Other gases that allow for selective movement of Co and/or uniform movement of Co may be used, such as, $N_2$ and He.

In some embodiments, after one or more additional cycles of depositing Co and performing anneal reflow process, Co may be deposited to form a final Co layer over the device and a final anneal reflow process may be performed, for example, a Hz-anneal reflow process.

Similar to the processes described above (FIGS. 8 and 9), in some embodiments, Co may be deposited in one or more trenches 220 via a bottom-up fill, such that no material or substantially no material is formed on the sidewalls of the trench prior to the Co reaching that point in the trench. As a result, no or substantially no competitive sidewall or top-down growth of Co in the trench may be present, leading to a substantially or completely void free fill of the trench with Co. After the bottom-up fill of Co in trenches 220, device 200 may be planarized using any suitable method, for example, via chemical mechanical planarization (CMP).

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of one or more aspects of the disclosure and the practical application, and to enable others of ordinary skill in the art to understand one or more aspects of the disclosure for various embodiments with various modifications as are suited to the particular use contemplated.

The invention claimed is:

1. A method comprising:
   providing an intermediate semiconductor device having at least one trench, the at least one trench having substantially parallel sidewalls;
   forming at least one layer of semiconductor material on the device;
   depositing a first cobalt (Co) layer on the at least one layer of semiconductor material;
   performing an anneal reflow process on the device, wherein the anneal reflow process causes the first Co layer to reflow to a bottom portion of the trench without filling the trench; and
   performing at least one cycle comprising:
      depositing a Co layer over the device; and
      performing an anneal reflow process on the device.

2. The method of claim 1, wherein the performing an anneal process comprises performing an argon anneal reflow process.

3. The method of claim 1, wherein the forming at least one layer of semiconductor material comprises depositing a layer of first semiconductor material on a bottom surface of the at least one trench and on the upper surface of the device.

4. The method of claim 3, wherein the forming at least one layer of semiconductor material further comprises depositing a layer of second semiconductor material layer on the layer of first semiconductor material and over the device.

5. The method of claim 1, wherein the depositing a first Co layer comprises depositing a continuous layer.

6. The method of claim 1, wherein the depositing a first Co layer comprises depositing a conformal layer.

7. The method of claim 1, wherein the performing an anneal reflow process comprises performing an argon anneal reflow process.

8. The method of claim 1 further comprising:
   filling the at least one trench with Co;
   performing an anneal reflow process; and
   planarizing the device.

9. The method of claim 8, wherein the performing an anneal reflow process comprises performing a $H_2$ anneal reflow process.

10. The method of claim 1 further comprising:
    performing oxidation of at least a portion of the first Co layer;
    removing at least a portion of the oxidized Co from the first Co layer;
    filling the at least one trench with Co; and
    planarizing the device.

11. The method of claim 10, wherein the removing at least a portion of the oxidized Co comprises removing at least a portion of the oxidized Co by an electrochemical bath.

12. An intermediate semiconductor device comprising:
    at least one trench formed within the device, the at least one trench comprising a bottom surface and substantially parallel sidewalls;
    at least one layer of semiconductor material disposed on the device; and
    a first cobalt (Co) layer disposed on the at least one layer of semiconductor material, wherein the first Co layer disposed on the bottom portion of the trench is thicker than the first Co layer disposed on the sidewalls of the trench and the trench is not completely filled,
    wherein the at least one layer of semiconductor material comprises at least a first semiconductor material and a second semiconductor material, wherein the second semiconductor material comprises one or more materials chosen from titanium nitride (TiN), tungsten carbide (WC), tungsten nitride (WN), tantalum nitride (TaN), and ruthenium (Ru).

13. The device of claim 12, wherein the first semiconductor material comprises one or more materials chosen from titanium (Ti), nickel (Ni), nickel platinum (NiPt), and cobalt (Co).

14. The device of claim 13, wherein the first semiconductor material is disposed on the bottom surface of the at least one trench and the top surface of the device.

15. The device of claim 12, wherein the first Co layer is a continuous layer.

16. The device of claim 12, wherein the first Co layer is a conformal layer.

17. The device of claim 12 further comprising a plurality of Co layers on the first Co layer.

* * * * *